(12) United States Patent
Aiki et al.

(10) Patent No.: US 10,002,699 B2
(45) Date of Patent: Jun. 19, 2018

(54) ELECTROMAGNETIC COIL DRIVING CONTROL DEVICE

(71) Applicant: Hitachi Automotive Systems, Ltd., Hitachinaka-shi, Ibaraki (JP)

(72) Inventors: Kiyoshi Aiki, Tokyo (JP); Ayumu Hatanaka, Tokyo (JP); Takuya Mayuzumi, Hitachinaka (JP); Katsuya Oyama, Hitachinaka (JP); Ryosuke Ishida, Hitachinaka (JP); Yasushi Sugiyama, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 289 days.

(21) Appl. No.: 14/785,528

(22) PCT Filed: Apr. 25, 2013

(86) PCT No.: PCT/JP2013/062164
§ 371 (c)(1),
(2) Date: Oct. 19, 2015

(87) PCT Pub. No.: WO2014/174626
PCT Pub. Date: Oct. 30, 2014

(65) Prior Publication Data
US 2016/0071642 A1     Mar. 10, 2016

(51) Int. Cl.
*H01F 7/20* (2006.01)
*H02M 1/44* (2007.01)
(Continued)

(52) U.S. Cl.
CPC .............. *H01F 7/204* (2013.01); *F02D 41/20* (2013.01); *H02M 1/44* (2013.01); *H02M 3/155* (2013.01);
(Continued)

(58) Field of Classification Search
CPC .......... H01F 7/204; F02D 41/20; H02M 1/44; H02M 3/155; H03K 17/162
See application file for complete search history.

(56) References Cited

U.S. PATENT DOCUMENTS

| | | | |
|---|---|---|---|
| 5,086,383 A | 2/1992 | Oda | |
| 8,456,144 B2 * | 6/2013 | Chatroux | ............ H02M 3/1584 323/235 |
| 2004/0212944 A1 * | 10/2004 | Tanzawa | ................. F02D 41/20 361/160 |

FOREIGN PATENT DOCUMENTS

| | | |
|---|---|---|
| CN | 1535355 A | 10/2004 |
| CN | 101237187 A | 8/2008 |

(Continued)

OTHER PUBLICATIONS

Chinese-language Office Action issued in counterpart Chinese Application No. 201380075899.7 dated Apr. 6, 2017 (Twelve (12) pages).

(Continued)

*Primary Examiner* — Scott Bauer
(74) *Attorney, Agent, or Firm* — Crowell & Moring LLP

(57) ABSTRACT

The present invention is to provide a magnet coil drive control device that can efficiently suppress conduction noise while reducing the capacitance of a capacitor. A capacitor and an impedance element are arranged in series on the connecting line connecting the positive electrode line and the negative electrode line of a DC power supply, the connecting line between the capacitor and the impedance element is connected to one end of a magnet coil via a freewheeling diode, and the portion between the freewheeling diode and the one end of the magnet coil is connected to the positive electrode line or the negative electrode line by a switching element. Conduction noise caused by the driving current of the magnet coil can be suppressed by the impedance element, and the capacitance of the capacitor can be further reduced. Accordingly, the magnet coil drive control device can be made smaller in size.

6 Claims, 15 Drawing Sheets

(51) Int. Cl.
*H02M 3/155* (2006.01)
*H03K 17/16* (2006.01)
*F02D 41/20* (2006.01)
*F02D 41/00* (2006.01)

(52) U.S. Cl.
CPC ..... *H03K 17/162* (2013.01); *F02D 2041/001* (2013.01); *F02D 2041/2041* (2013.01); *H02M 2003/1555* (2013.01)

(56) References Cited

FOREIGN PATENT DOCUMENTS

| | | | |
|---|---|---|---|
| CN | 102614592 A | 8/2012 | |
| DE | 33 41 767 A1 | 5/1985 | |
| EP | 1 424 477 A1 | 6/2004 | |
| JP | 61-42274 A | 2/1986 | |
| JP | 61-182205 A | 8/1986 | |
| JP | 6-315261 A | 11/1994 | |
| JP | 7-288999 A | 10/1995 | |
| JP | 10-4679 A | 1/1998 | |
| JP | 10-136637 A | 5/1998 | |
| JP | 2006-351910 A | 12/2006 | |

OTHER PUBLICATIONS

International Search Report (PCT/ISA/210) issued in PCT Application No. PCT/JP2013/062164 dated Jun. 11, 2013 with English-language translation (five (5) pages).

Japanese-language Written Opinion (PCT/ISA/237) issued in PCT Application No. PCT/JP2013/062164 dated Jun. 11, 2013 (three (3) pages).

Extended European Search Report issued in counterpart European Application No. 13882791.0 dated Feb. 15, 2017 (Seven (7) pages).

* cited by examiner (1) SOLENOID VOLTAGE (V)

(2) SOLENOID CURRENT (A)

(3) FREEWHEELING DIODE CURRENT (A)

(4) CAPACITOR CURRENT (A)

(5) CAPACITOR VOLTAGE (V)

(6) POWER-SUPPLY VOLTAGE (V)

TIME AXIS: UNIT (μs)

(1) SOLENOID VOLTAGE (V)

(2) SOLENOID CURRENT (A)

(3) FREEWHEELING DIODE CURRENT (A)

(4) CAPACITOR CURRENT (A)

(5) CAPACITOR VOLTAGE (V)

(6) POWER-SUPPLY VOLTAGE (V)

TIME AXIS: UNIT ($\mu$s)

(2) IN CASE OF 10μF AND 6Ω

| OPERATION MODE | HS1 | HS2 | LS1 | LS2 | S1 | S2 | S3 | S4 | S5 | S6 | S7 | S8 | S9 | SA | SB | SC |
|---|---|---|---|---|---|---|---|---|---|---|---|---|---|---|---|---|
| 1 | off | on | ck | off | 0 | 1 | 1 | 0 | 1 | 0 | 0 | 0 | 1 | 1 | 0 | 0 |
| 2 | on | off | off | ck | 1 | 0 | 0 | 1 | 0 | 1 | 0 | 0 | 1 | 1 | 0 | 0 |
| 3 | ck | off | off | on | 1 | 0 | 0 | 1 | 0 | 0 | 1 | 0 | 0 | 0 | 1 | 1 |
| 4 | off | ck | on | off | 0 | 1 | 1 | 0 | 0 | 0 | 0 | 1 | 0 | 0 | 1 | 1 |

HS1,HS2,LS1,LS2
on: ON-STATE
off: OFF-STATE
ck: SWITCHING STATE

S1 TO SC
1: ON-STATE
0: OFF-STATE

ELECTROMAGNETIC COIL DRIVING CONTROL DEVICE

TECHNICAL FIELD

The present invention relates to a magnet coil drive control device to be used in an adjustment mechanism that uses an electromagnet or in a motor, and more particularly, to a magnet coil drive control device to which electrical power is supplied from a DC power supply.

BACKGROUND ART

For automobiles and the like, there is a demand for improvements of the fuel efficiency (fuel consumption) of internal-combustion engines, not only to cope with environmental issues and comply with exhaust emission regulations, but also to meet the increase in awareness of energy conversion and prevent resource depletion. Therefore, the combustion efficiency of internal-combustion engines is increased to reduce the fuel used in combustion, and further, the hazardous components in emissions are reduced.

As an example for increasing the combustion efficiency of an internal-combustion engine, a valve timing control (VTC) device is known. The valve timing control device optimizes the timings to open and close the inlet valve and the outlet valve based on the engine speed and the intake air quantity (load) of the internal-combustion engine. This valve timing control device includes a hydraulic mechanism that rotates a camshaft in a relative manner, and controls the position of a hydraulic control valve that uses an electromagnet. In this manner, the oil quantity of the hydraulic mechanism is adjusted so that the timings to open and close the inlet valve and the outlet valve are changed.

Other than the valve timing control device, a gearshift control valve that is used in an automatic transmission, an electronic throttle control device provided in an air intake passage, or the like is used to improve fuel efficiency. Such devices have electromagnets and motors as principal drive sources, and are driven and controlled by electrical power supplied to magnet coils. In view of the above, a magnet coil drive control device that controls power to be supplied to an electromagnet or the magnet coil of a motor is essential in operating the mechanical part of an automobile.

For example, in a drive control device for driving a magnet coil according to JP 2006-35910 A (PTL 1), a low-side switch is provided for the magnet coil, and the current and the like flowing into the magnet coil are controlled by opening and closing this switch. PTL 1 discloses a method of shortening the time of attenuation of inductive current generated in the magnet coil, so as to restrain increases in the temperature of the magnet coil.

CITATION LIST

Patent Literature

PTL 1: JP 2006-351910 A

SUMMARY OF INVENTION

Technical Problem

In a magnet coil drive control device that drives and controls a magnet coil, when the current flowing into the magnet coil is turned on and off to drive the magnet coil in an excited state or an unexcited state, conduction noise is generated in a cable connected to the positive electrode of the DC power supply or a wire of a substrate pattern or the like, due to the turning on and off of the current flowing into the magnet coil.

In conventional cases, a method of absorbing conduction noise by providing a high-capacitance capacitor on a wire has been popular. In recent year, however, there has been an increasing demand for decreases in size of high-capacitance capacitors and effective restraints on conduction noise, for reasons such as the decrease in size of each magnet coil drive control device.

To respond to such a demand, the present invention aims to provide a magnet coil drive control device that can efficiently suppress conduction noise while reducing the capacitance of a capacitor.

Solution to Problem

The present invention is characterized in that a capacitor and an impedance element are arranged in series on the connecting line connecting the positive electrode line and the negative electrode line of a DC power supply, the connecting line between the capacitor and the impedance element is connected to the opposite end of a magnet coil connected to the positive electrode side of the DC power supply via a freewheeling diode, and the connecting line between the freewheeling diode and the end of the magnet coil is connected to the positive electrode line or the negative electrode line by a connecting line having a switching element thereon. Here, the switching element serves as the high-side switch when connected to the positive electrode line, and serves as the low-side switch when connected to the negative electrode line.

Advantageous Effects of Invention

According to the present invention, conduction noise caused by the driving current of a magnet coil can be suppressed by an impedance element, and the capacitance of a capacitor can be further reduced. Accordingly, a magnet coil drive control device can be made smaller in size.

DESCRIPTION OF EMBODIMENTS

The following is a detailed description of embodiments of the present invention, with reference to the accompanying drawings. However, the present invention is not limited to the embodiments described below, and various modifications and applications fall within the technical scope of the invention.

First Embodiment

Figure 1:
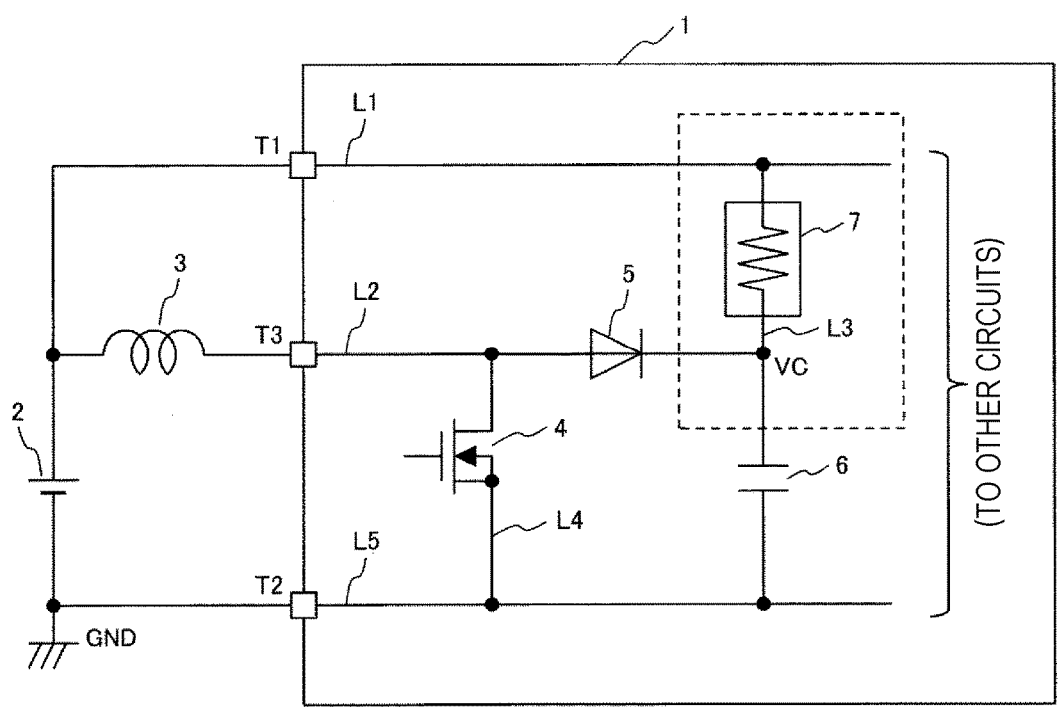
FIG. 1 is a circuit diagram showing the circuit configuration of a magnet coil drive control device according to a first embodiment of the present invention.

Referring now to FIG. 1, a first embodiment of the present invention is described in detail. In FIG. 1, reference numeral 1 indicates a magnet coil drive control device according to the present invention, and a circuit element that controls the current flowing into a magnet coil 3 is provided therein. The magnet coil 3 is used in various kinds of adjusting mechanisms, and, in this embodiment, is a magnet coil of a hydraulic control valve that is used in a valve timing control device. A hydraulic control valve is a control valve that linearly shifts in position depending on the magnitude of electrical current, and can control the position of a needle in accordance with the average current value that varies with the on/off ratio (duty) of the driving current. A direct-driven electrical device of this type is normally called a solenoid, and therefore, the magnet coil 3 will be hereinafter referred to as the solenoid 3. This drawing shows the circuit element that drives the solenoid 3, and explanation of circuit elements other than that will not be made below.

Terminals T1, T2, and T3 are provided in the magnet coil drive control device 1. The terminal T1 is connected to a DC power supply 2 such as the positive electrode terminal of an in-vehicle battery, the terminal T2 is connected to the negative electrode terminal of the DC power supply 2, and the terminal T3 is connected to the positive electrode terminal of the DC power supply 2 via the solenoid 3. This solenoid 3 is a coil for forming an electromagnet, and the hydraulic control valve shifts in position depending on the current flowing in the solenoid 3. Accordingly, the oil quantity of the hydraulic mechanism can be adjusted. This type of mechanism is well known, and therefore, will not be described in detail herein.

The terminal T1 is connected to a positive electrode line L1 in the magnet coil drive control device 1, and the terminal T2 is connected to a negative electrode line L5 in the magnet coil drive control device 1. The positive electrode line L1 and the negative electrode line L5 are connected by a connecting line L3, and, on the connecting line L3, an impedance element 7 and a capacitor 6 are arranged and connected in series in the direction from the positive electrode line L1 toward the negative electrode line L5. The connecting line L3 between the capacitor 6 and the impedance element 7 is connected to one end of the solenoid 3 by a connecting line L2, and a freewheeling diode 5 is provided on the connecting line L2. The cathode side of the freewheeling diode 5 is connected to the connecting line L3 between the capacitor 6 and the impedance element 7, and the anode side of the freewheeling diode 5 is connected to the one end of the solenoid 3.

Here, various kinds of capacitors including an electrolytic capacitor can be used as the capacitor 6. In this embodiment, however, a ceramic capacitor is used, because a ceramic capacitor is suitable for restraining noise generation, having a low equivalent series resistance (ESR).

Further, the portion between the anode side of the freewheeling diode 5 and the one end of the solenoid 3 is connected to the negative electrode line L5 by a connecting line L4, and a switching element 4 as a low-side switch is connected to the connecting line L4. This switching element 4 is a MOS-FET, the drain side of the switching element 4 is connected to the portion between the anode side of the freewheeling diode 5 and the one end of the solenoid 3, and the source side of the switching element 4 is connected to the negative electrode line L5.

The positive electrode side of the DC power supply 2 is connected to another circuit in the magnet coil drive control device 1 via the positive electrode line L1, and the GND side of the DC power supply 2 is connected to another circuit in the magnet coil drive control device 1 via the negative electrode line L5, so that power is supplied thereto. However, this aspect is not relevant to the present invention, and will not be described in detail herein.

In the above described structure, when a predetermined control signal is supplied to the gate of the switching element 4, the switching element 4 transits to an on-state, the drain voltage becomes 0 V, and current flows into the solenoid 3. The current flowing into the solenoid 3 is the driving current flowing into the solenoid 3 as the DC power supply 2 and the solenoid 3 form a closed circuit when the switching element 4 is in an on-state. This driving current increases with time, and electrical energy is accumulated in the inductance of the solenoid 3.

When the switching element 4 transits to an off-state, on the other hand, the solenoid 3, the freewheeling diode 5, and the impedance element 7 form a closed circuit, and a freewheeling current flows. The freewheeling current flows so that the electrical energy accumulated in the inductance of the solenoid 3 is released, and the current decreases with time. The freewheeling current is the current that flows as the solenoid 3, the freewheeling diode 5, and the impedance element 7 form a closed circuit when the switching element 4 is in an off-state. When the switching element 4 is in an on-state, the voltage on the anode side of the freewheeling diode 5 is 0 V, and therefore, the cathode voltage is high. That is, a reverse bias state is formed, and current does not flow.

Furthermore, when the switching element 4 is in an off-state, the DC power supply 2, the solenoid 3, the freewheeling diode 5, and the capacitor 6 form a closed circuit, and charge is accumulated in the capacitor 6. When the switching element 4 is in an on-state, on the other hand, current does not flow into the freewheeling diode 5. Therefore, the charge accumulated in the capacitor 6 while the switching element 4 is in an off-state flows out toward the impedance element 7. The charge accumulated in the capacitor 6 is applied to the positive electrode line IA. However, there is the impedance element 7 provided between the capacitor 6 and the positive electrode line L1 in this embodiment. Therefore, the charge accumulated in the capacitor 6 is consumed by the impedance element 7, and is not superimposed on the positive electrode line L1. With this, ripple voltage generation is restrained on the positive electrode line L1, and conduction noise can be reduced. This ripple voltage is conduction noise at the high frequency corresponding to the on/off ratio in the solenoid 3.

Figures 13, 14:
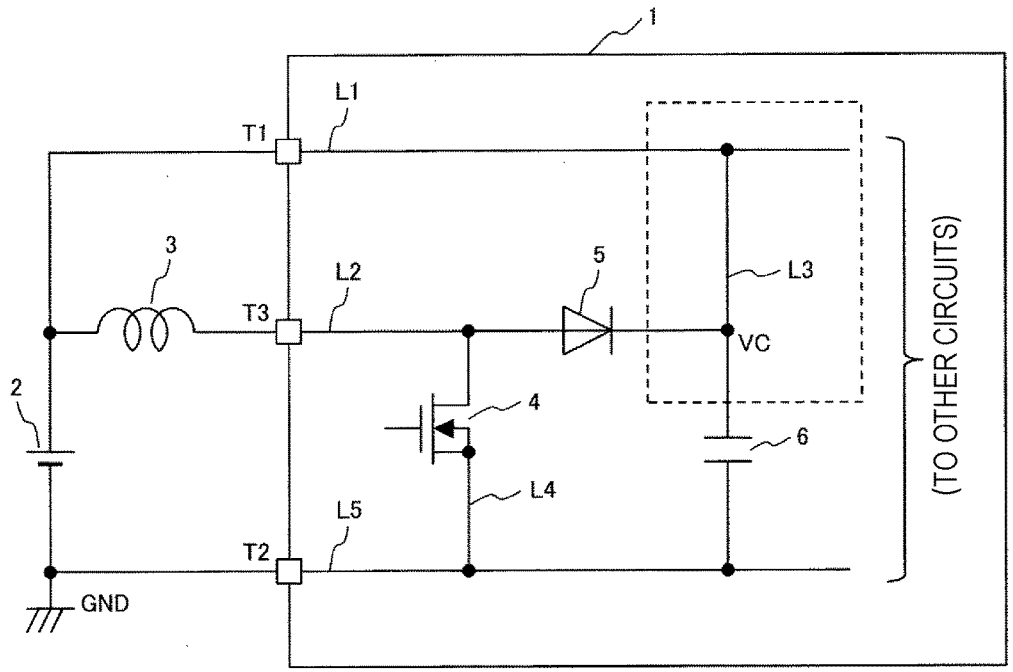
FIG. 13 is an explanatory diagram for explaining operating states of the respective switching elements of the magnet coil drive control device according to the fourth embodiment shown in FIG. 11.
FIG. 14 is a circuit diagram showing the circuit configuration of the conventional magnet coil drive control device.

For purpose of comparison with this embodiment, FIG. 14 shows a conventional magnet coil drive control device that does not include the impedance element 7. As can be seen from FIG. 14, the difference from this embodiment is the portion in a rectangle drawn with a dashed line. As shown in FIG. 14, the conventional magnet coil drive control device has a circuit configuration in which the connecting point between the freewheeling diode 5 and the capacitor 6 is connected directly to the positive electrode line L1 on the power supply side via the connecting line L3. Therefore, to reduce ripple voltage, the capacitance of the capacitor 6 needs to be increased. As a result, the magnet coil drive control device 1 becomes larger in size by the amount equivalent to the increase in the capacitance of the capacitor 6.

In this embodiment, on the other hand, ripple voltage can be reduced by the impedance element 7. Accordingly, conduction noise can be efficiently suppressed, and the capacitance of the capacitor 6 can be made smaller. Thus, the magnet coil drive control device 1 can be made smaller in size.

Figure 2A:
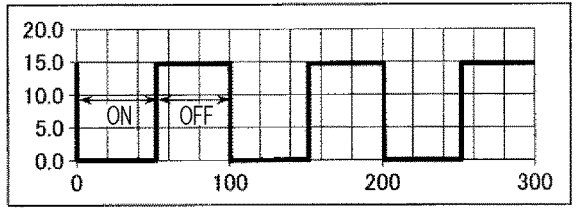
FIG. 2A is an explanatory diagram showing changes in the voltage and the current of a magnet coil, the current of a freewheeling diode, the voltage and the current of a capacitor, and a power-supply voltage, to explain conduction noise in a conventional magnet coil drive control device.
Figure 2A:
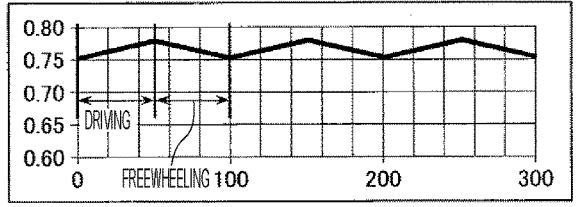
Figure 2A:
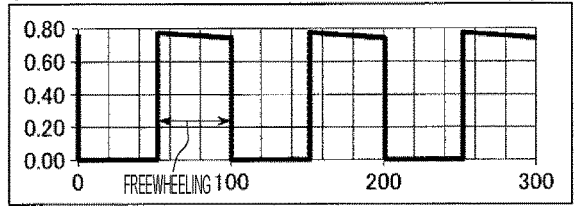
Figure 2A:
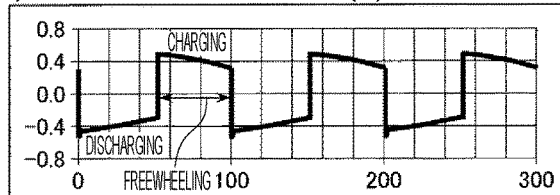
Figure 2A:
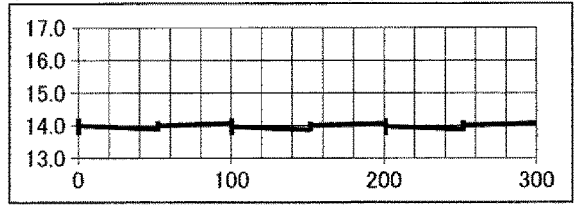
Figure 2A:
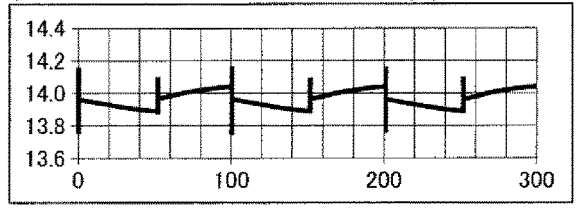
Figure 2B:
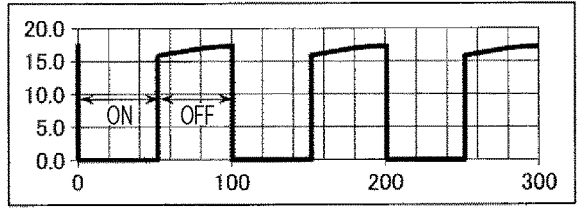
FIG. 2B is an explanatory diagram showing changes in the voltage and the current of a magnet coil, the current of a freewheeling diode, the voltage and the current of a capacitor, and a power-supply voltage, to explain conduction noise in the magnet coil drive control device shown in FIG. 1.
Figure 2B:
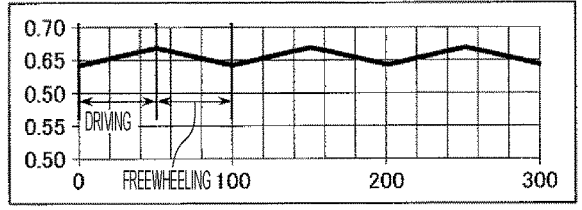
Figure 2B:
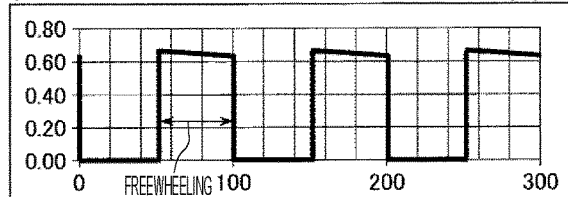
Figure 2B:
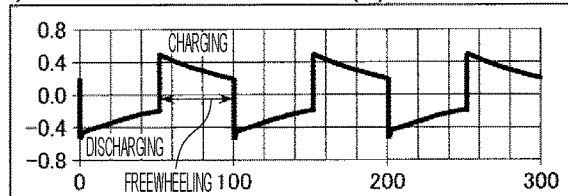
Figure 2B:
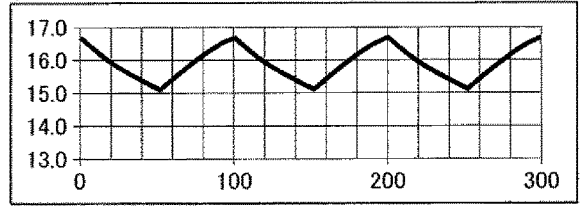
Figure 2B:
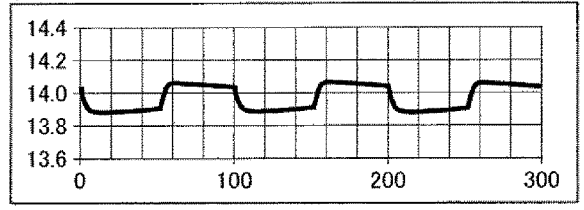

Next, operation of the magnet coil drive control device according to the first embodiment shown in FIG. 1 is described while being compared with operation of the conventional magnet coil drive control device shown in FIG. 14. FIGS. 2A and 2B show example cases where the voltage of the DC power supply 2 (an in-vehicle battery in this embodiment) is 14 V, the inductance of the coil of the solenoid 3 is 15 mH, the resistance value of the coil is 8Ω, the drive frequency of the switching element 4 is 10 kHz, and the duty is 50%.

FIG. 2A shows a case where the capacitance of the capacitor 6 is 220 μF in the conventional magnet coil drive control device shown in FIG. 14. FIG. 2B shows an example case where the capacitance of the capacitor 6 is 10 μF, and the impedance element 7 has a resistance value of 6Ω in the magnet coil drive control device shown in FIG. 1. In this embodiment, the capacitance of the capacitor 6 is ½₂. In the description below, the behavior of the currents and the voltages of the respective circuit elements will be explained.

(1) The Solenoid Voltage Shown in FIGS. 2A and 2B

The voltage of the solenoid 3 is the voltage on the drain side of the switching element 4. This is the on- or off-state in a case where the drive frequency is 10 kHz, and the duty is 50%. When the switching element 4 is in an on-state, the drain voltage is approximately 0 V, and current flows into the solenoid 3. When the switching element 4 is in an off-state, the drain voltage is approximately 14 V, and current is blocked from flowing into the solenoid 3.

(2) The Solenoid Current Shown in FIGS. 2A and 2B

Solenoid current is the current on the drain side of the switching element 4. When the switching element 4 is in an on-state, the DC power supply 2 and the solenoid 3 form a closed circuit, and the driving current flows into the solenoid 3. This driving current increases with time, and electrical energy is accumulated in the inductance of the solenoid 3. When the switching element 4 is in an off-state, the solenoid 3, the freewheeling diode 5, and the impedance element 7 forma closed circuit, and a freewheeling current flows. The freewheeling current flows so that the electrical energy accumulated in the inductance of the solenoid 3 is released, and the current decreases with time. In the conventional magnet coil drive control device, the impedance element 7 is not provided, and therefore, the charge in the capacitor 6 is not consumed as will be described later.

(3) The Freewheeling Current Shown in FIGS. 2A and 2B

A freewheeling current is the current that flows when the switching element 4 is in an off-state, and the solenoid 3, the freewheeling diode 5, and the impedance element 7 forma closed circuit. In each of the drawings, the current on the cathode side of the freewheeling diode 5 is shown. When the switching element 4 is in an on-state, the anode voltage of the freewheeling diode 5 is 0 V, and therefore, the cathode voltage is high. That is, a reverse bias state is formed, and current does not flow. In the conventional magnet coil drive control device in this case, the impedance element 7 is not provided, and therefore, the charge in the capacitor 6 is not consumed, either, as will be described later.

(4) The Capacitor Current Shown in FIGS. 2A and 2B

When the switching element 4 is in an off-state, the DC power supply 2, the solenoid 3, the freewheeling diode 5, and the capacitor 6 form a closed circuit, and charge is accumulated in the capacitor 6. When the switching element 4 is in an on-state, current does not flow into the freewheeling diode 5. Therefore, the charge accumulated so far flows out toward the impedance element 7. In each of the drawings, the current between the capacitor 6 and the connecting point (indicated as VC) between the connecting line L2 and the connecting line L3 is shown. In the conventional magnet coil drive control device, the impedance element 7 is not provided, and therefore, the charge in the capacitor 6 flows out toward the positive electrode line L1.

(5) The Capacitor Voltage Shown in FIGS. 2A and 2B

In the steady state, the voltage of the capacitor 6 (VC point) is 14 V, which is the voltage of the DC power supply 2, and is superimposed by the amount equivalent to the change in voltage caused by the capacitor current. In each of the drawings, it is the voltage at the connecting point (indicated as VC) between the connecting line L2 and the connecting line L3. This voltage is normally determined according to V=IT/C based on Q=IT and Q=CV, and it becomes apparent that this voltage is proportional to the current, and is inversely proportional to the capacitance. Here, Q represents the charge, C represents the capacitance, V represents the voltage between electrodes, I represents the current flowing between electrodes, and T represents the time.

In the conventional magnet coil drive control device shown in FIG. 2A, the capacitor current is approximately 0.4 A, the time is approximately 50 μs, and the electrostatic capacitance is 220 μF. Accordingly, the capacitor voltage is expressed as $$V=14+0.4\times50/220=14+0.1=14.1(V).$$

In the magnet coil drive control device shown in FIG. 2B, the capacitor current is approximately 0.4 A, the time is approximately 50 μs, and the electrostatic capacitance is 10 μF. Accordingly, the capacitor voltage is expressed as $$V=14+0.4\times50/10=14+2.5V=16.5(V).$$

(6) The Power-Supply Voltage Shown in FIGS. 2A and 2B

The power-supply voltage is the voltage of the positive electrode line L1 or the terminal T1. In the conventional magnet coil drive control device shown in FIG. 2A, the amount of the ripple voltage of the power supply is determined from the difference between the maximum voltage and the minimum voltage, and is as low as several hundreds of mV in this example. This is because the capacitance of the capacitor 6 is as high as 220 μF, and therefore, the change in voltage is small, though the charge in the capacitor 6 propagates directly to the positive electrode line L1 in the circuit configuration. However, if the capacitor 6 is made larger in this manner, the magnet coil drive control device becomes larger in size, which is not preferable.

In the magnet coil drive control device according to this embodiment shown in FIG. 2B, the ripple voltage of the power supply is also as low as several hundreds of mV. This is because, even if the capacitance of the capacitor 6 is greatly reduced, the voltage (approximately 2.5 V in this case) generated in the capacitor 6 is consumed by the impedance element 7 and does not appear on the positive electrode line L1, since the impedance element 7 is provided between the capacitor 6 and the positive electrode line L1. In this manner, the capacitance of the capacitor 6 can be reduced while conduction noise is suppressed. Accordingly, the magnet coil drive control device can be made smaller in size.

In a case where the impedance of the wires and the like between the DC power supply 2 and the impedance element 7 is 0Ω, for example, the voltage of the terminal T1 is fixed at 14 V, and the ripple voltage of the power supply is 0 V. In reality, however, there exist a wiring inductance and a wiring resistance between the DC power supply 2 and the impedance element 7, and therefore, there is some impedance. At the terminal T1 in that case, the voltage corresponding to the partial pressure ratio between the wiring impedance and the impedance element 7 is observed. If the wiring inductance is pH, for example, the wiring impedance (reactance) is approximately 0.6Ω. In a case where the change in the impedance element 7 is 6Ω, and the change in the voltage of the capacitor 6 is 2.5 V, the ripple voltage can be V=2.5×0.6/(0.6+6)=0.2 V, which is sufficiently low.

As described above, the conventional magnet coil drive control device is designed to suppress conduction noise with the high-capacitance capacitor 6, and accordingly, can suppress conduction noise. However, the capacitance thereof is high, and the magnet coil drive control device becomes larger in size.

In this embodiment, on the other hand, conduction noise is sufficiently suppressed with the impedance element 7 and the capacitor 6, and the capacitance of the capacitor 6 can be further reduced by a considerable amount. Accordingly, the magnet coil drive control device can be made smaller in size.

Next, the standards for conduction noise are briefly described. The international standards include CISPR25 (1995) "Limits and methods of measurement of radio disturbance characteristics for the protection of receivers used on board vehicles", which is a standard created by International Special Committee on Radio Interference (CISPR). The CISPR25 standard relates to radio interference in the frequency band of 150 kHz to 1,000 MHz, and is applied to electronic components to be used in vehicles. The recommended values are set for protecting receivers in a vehicle from interfering waves generated from components and modules in the same vehicle, and the receivers to be protected are radio receivers, television receivers, and radio devices, for example.

Figure 3:
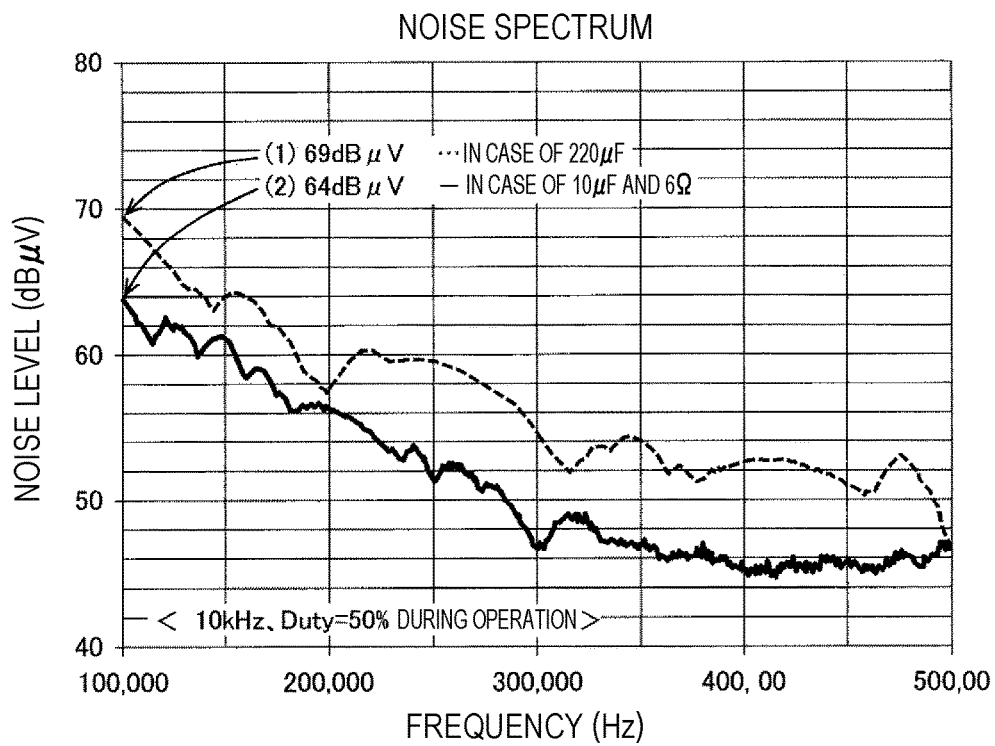
FIG. 3 is an explanatory diagram showing noise spectra for comparing the magnet coil drive control device shown in FIG. 1 with the conventional magnet coil drive control device.

The noise spectra of the embodiment shown in FIG. 1 and the conventional example shown in FIG. 14 were measured in accordance with this standard. The noise spectra are noise derived from the voltage of the power-supply line between the terminal T1 and the DC power supply 2. As shown in FIG. 3, the frequency ranges from 100 kHz to 500 kHz. In the conventional example shown in FIG. 14, the capacitance of the capacitor 6 is set at 220 μF. In this embodiment shown in FIG. 1, the capacitance of the capacitor 6 is set at 10 μF, the impedance element 7 is a resistor, and the resistance value of the resistor is set at 6Ω. The noise level at a measurement frequency of 100 kHz was 69 dBpV in the conventional example (indicated by the dashed line), and was 64 dBpV in this embodiment (indicated by the solid line). Further, it is clear that the noise level becomes lower as the measurement frequency becomes higher, but the noise level is kept lower in this embodiment than in the conventional example.

As can be seen from the above, the noise suppressing effect is increased according to this embodiment as indicated by the solid line, compared with the noise suppressing effect (noise level) achieved by the conventional example as indicated by the dashed line. Accordingly, the noise level in this embodiment is lower than that in the conventional example.

Figure 4A:
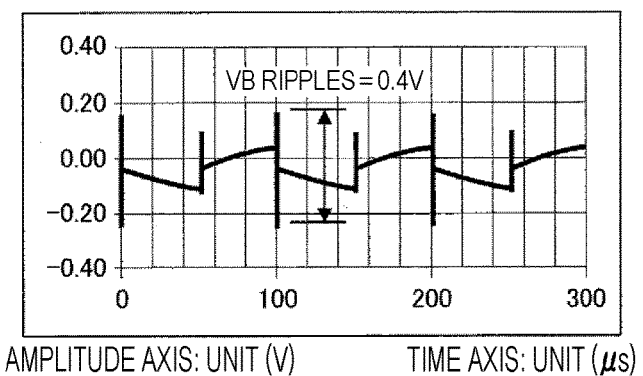
FIG. 4A is a characteristic diagram showing the ripple voltage of the power supply for the conventional magnet coil drive control device.
Figure 4B:
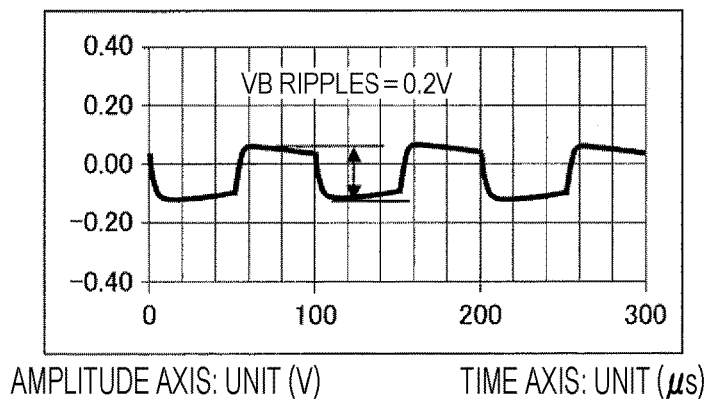
FIG. 4B is a characteristic diagram showing the ripple voltage of the power supply for the magnet coil drive control device shown in FIG. 1.

Further, FIG. 4A shows the amount of the ripple voltage in the conventional example shown in FIG. 14, and FIG. 4B shows the amount of the ripple voltage in this embodiment shown in FIG. 1. While the ripple voltage is 0.4 V in the conventional example, the ripples voltage is reduced to 0.2 V according to this embodiment. As can be seen from that, the amount of the ripple voltage is almost halved, and the noise level is efficiently lowered.

Figure 5:
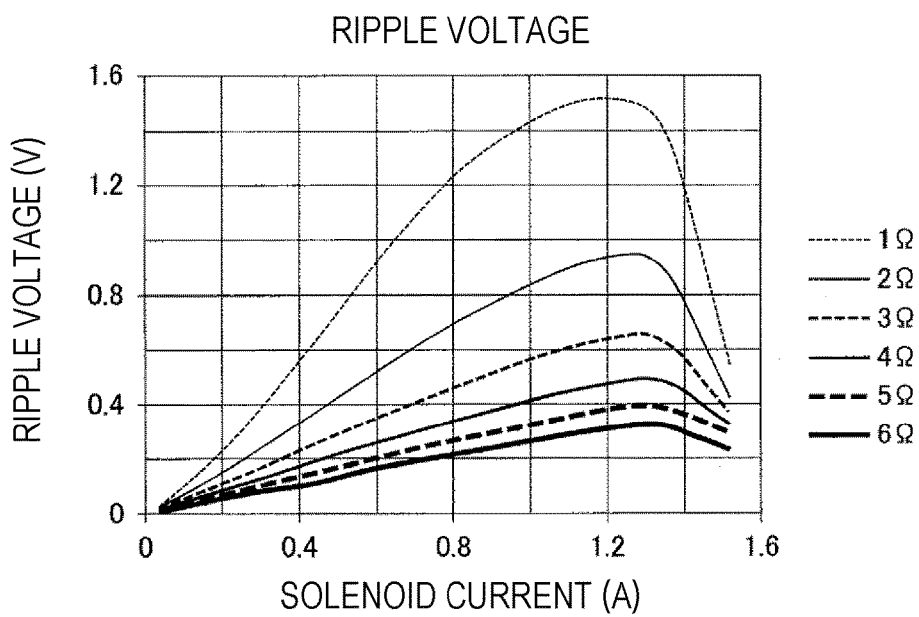
FIG. 5 is an explanatory diagram showing the relationship between the current flowing in a solenoid and the ripple voltage, with respect to the resistance value of an impedance element.

FIG. 5 shows the relationship between the driving current flowing in the solenoid 3 and the ripple voltage, with respect to the resistance value of the impedance element 7. According to this embodiment, the amplitude of the ripple voltage can be made smaller as the resistance value of the impedance element 7 becomes higher. As mentioned earlier, this ripple voltage is observed as the voltage corresponding to the partial pressure ratio between the wiring impedance from the DC power supply 2 and the impedance element 7. Accordingly, as the value of the impedance element 7 becomes higher, the partial pressure ratio becomes higher, and the ripple voltage becomes lower.

Figure 6:
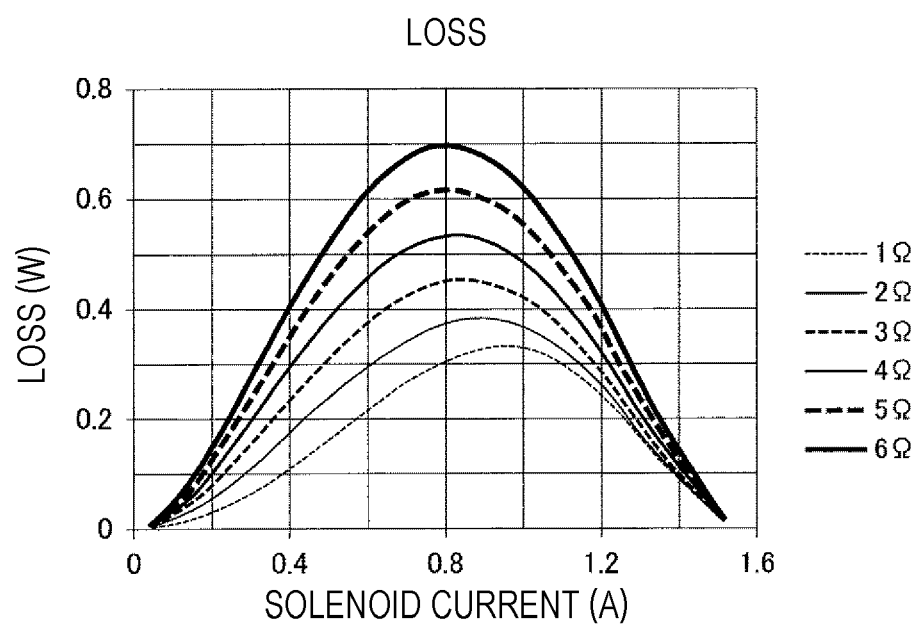
FIG. 6 is an explanatory diagram showing the relationship between the current flowing in a solenoid and loss, with respect to the resistance value of an impedance element.

FIG. 6 shows the relationship between the driving current in the solenoid 3 and loss in the impedance element 7, with respect to the resistance value of the impedance element 7. According to this embodiment, the loss becomes larger as the resistance value of the impedance element 7 becomes higher. The loss is caused by the impedance element 7 and the current flowing in the impedance element 7. Therefore, if the solenoid current stays the same, the loss is proportional to the resistance value of the impedance element 7.

In the above manner, the ripple voltage and the loss in the impedance element 7 are in an inverse relationship That is, to reduce conduction noise, the resistance value of the impedance element 7 is preferably increased. In view of loss, however, the resistance of the impedance element 7 is preferably lowered. Accordingly, the range of the value of the impedance element 7 is spontaneously defined based on the range in which the ripple voltage is allowed, and the range in which the loss in the impedance element 7 is allowed. For example, a resistance value of 6Ω is selected in a case where the maximum value of the ripple voltage is 0.4 V or lower, and the loss in the impedance element is allowed up to 0.7 W. A resistance value of 2Ω is selected in a case where the maximum value of the ripple voltage is 1.4 V or lower, and the loss in the impedance element is allowed up to 0.4 W.

In this manner, the resistance value of the impedance element 7 can be appropriately selected in accordance with the specifications of the magnet coil drive control device based on the relationship between the ripple voltage and the loss. In short, a resistance value that can efficiently reduce conduction noise and loss should be selected.

In the above described example, the impedance element 7 is a resistor. However, the impedance element 7 may be a combination of a resistor and a passive element that is not a resistor, an active element, or another resistor, as shown in FIGS. 7A through 7F. Referring now to FIGS. 7A through 7F, specific structures of such impedance elements 7 are described. In the structures suggested in FIGS. 7A through 7F, a resistor is the fundamental component so as to efficiently reduce noise, and this resistor is combined with one or more other impedance elements.

Figure 7A:
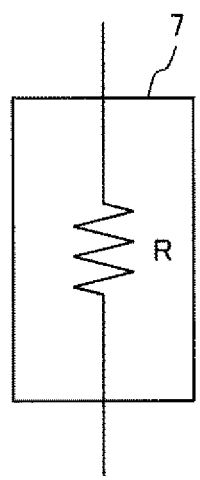
FIG. 7A is an explanatory diagram of a circuit element, showing a first example of an impedance element.

FIG. 7A shows an example where one resistor is used as the impedance element 7. As only one resistor is used, the installation area of the circuit can be reduced, and costs can also be effectively lowered.

Figure 7B:
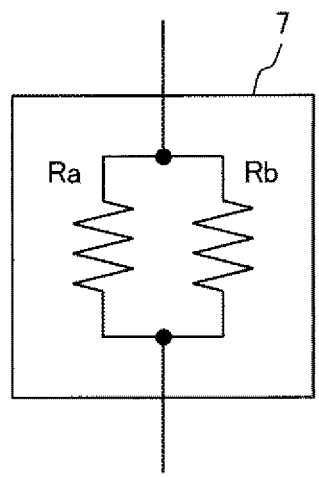
FIG. 7B is an explanatory diagram of a circuit element, showing a second example of an impedance element.

FIG. 7B shows an example where two resistors arranged in parallel are used as the impedance element 7. The loss in the impedance element 7 is proportional to the square of the current flowing therein. Therefore, it is divided between a resistor Ra and a resistor Rb, so that the loss in each of the resistors is effectively halved.

Figure 7C:
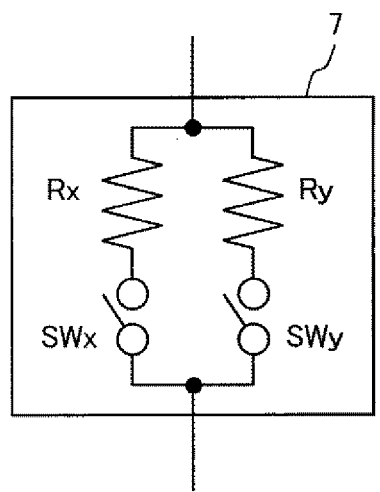
FIG. 7C is an explanatory diagram of a circuit element, showing a third example of an impedance element.

FIG. 7C shows an example where the impedance element 7 is formed with resistors (two resistors in this example) and resistance adjusting elements or switching elements for selecting the respective resistors. In this example, two resistors and two switching elements are provided. A resistor Rx and a resistor Ry preferably have different resistance values. With this, different selections can be made depending on a combination of switching on and switching off of a switch SWx and a switch SWy. For example, if one resistance value is set at a large value while the other resistance value is set at a small value, conduction noise is more strongly suppressed when the one resistance value is selected, and loss can be made even smaller when the other resistance value is selected.

Figure 7D:
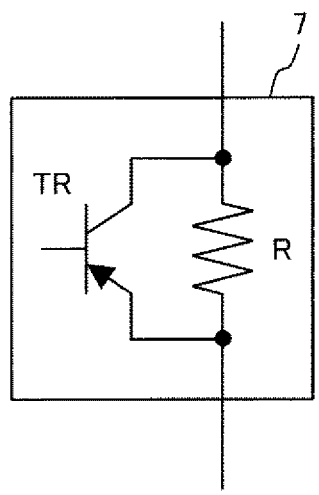
FIG. 7D is an explanatory diagram of a circuit element, showing a fourth example of an impedance element.

FIG. 7D shows an example where the impedance element 7 is formed with a structure in which a resistor is connected in parallel between the collector and the emitter of a bipolar transistor TR having the function of a resistance adjusting element. As the base current of the bipolar transistor TR is controlled, the on-state resistance between the collector and the emitter is changed, and a resistance in parallel with a resistor R can be formed. Accordingly, the resistance value can be changed in a non-step manner. This has the effect to suppress conduction noise and appropriately select loss. If the bipolar transistor TR breaks down in an off-state, the resistor R can be used singly. Thus, a fail-safe function can be provided.

Figure 7E:
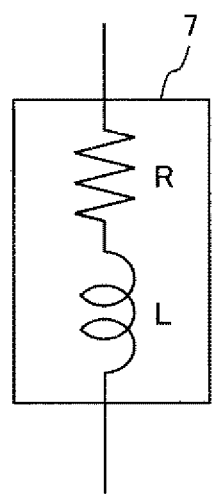
FIG. 7E is an explanatory diagram of a circuit element, showing a fifth example of an impedance element.

FIG. 7E shows an example where the impedance element 7 is formed with a combination of a resistor R and an inductance L arranged in series. This structure is effective in increasing the frequency impedance in a high-frequency band, or in suppressing high-frequency conduction noise.

Figure 7F:
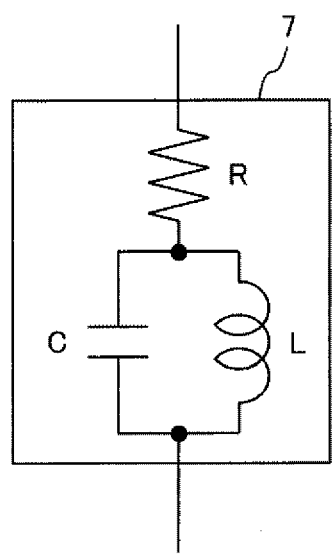
FIG. 7F is an explanatory diagram of a circuit element, showing a sixth example of an impedance element.

FIG. 7F shows an example where a resistor R and a parallel resonance circuit formed with an inductance L and a capacitor C are connected in series to form the impedance element 7. This structure is effective in increasing the impedance at a certain frequency, or in suppressing certain conduction noise.

If the impedance element 7 shown in FIG. 7E or FIG. 7F is used, it is very easy to appropriately combine a resistor with an inductance and a capacitor. Also, not having loss, an inductance and a capacitor are preferable as an impedance element.

As described above, according to the first embodiment, the impedance element 7 and the capacitor 6 are provided on the connecting line L3 connecting the positive electrode line L1 and the negative electrode line L5 of the DC power supply, and are arranged in series in the direction from the positive electrode line L1 toward the negative electrode line L5. The connecting line L3 between the impedance element 7 and the capacitor 6 is connected to one end of the solenoid 3 via the freewheeling diode so that a freewheeling current flows into the impedance element 7 and the capacitor 6. Further, the portion between the anode side of the freewheeling diode 5 and the one end of the solenoid 3 is connected to the negative electrode line L5 by the low-side switching element 4.

In this structure, conduction noise caused by the driving current of the solenoid 3 can be suppressed by the impedance element 7, and the capacitance of the capacitor 6 can be further reduced. Accordingly, the magnet coil drive control device can be made smaller in size.

Second Embodiment

Figure 8:
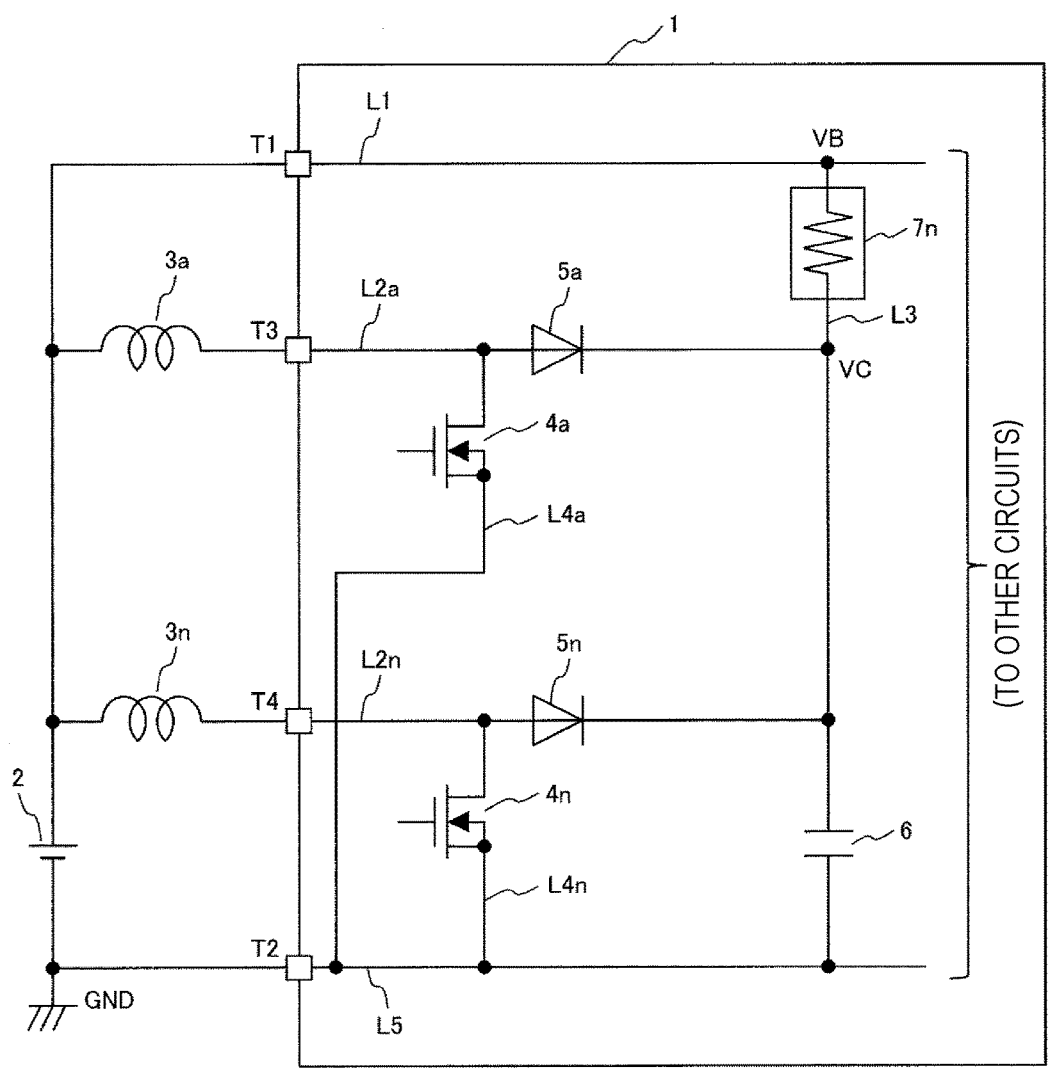
FIG. 8 is a circuit diagram showing the circuit configuration of a magnet coil drive control device according to a second embodiment of the present invention.
Figure 9:
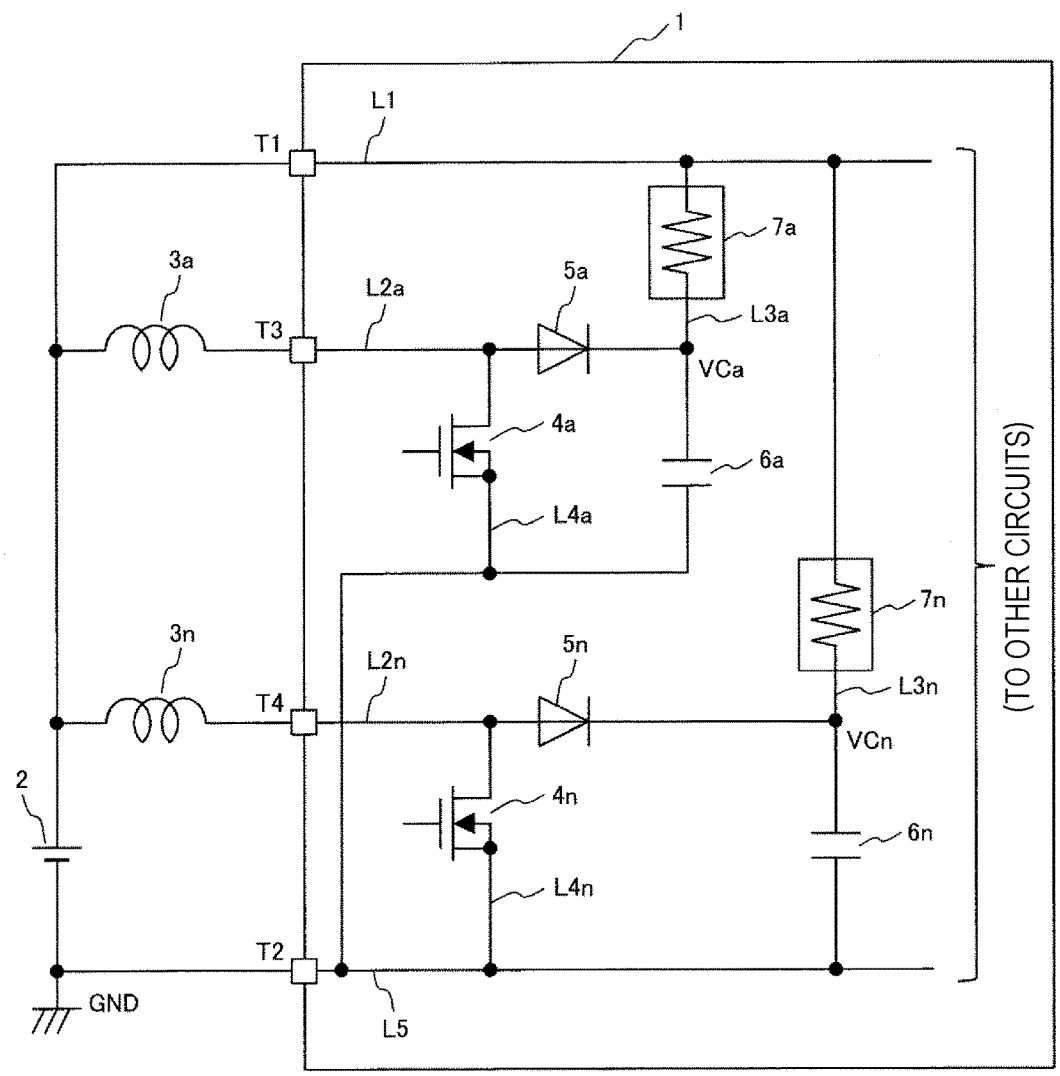
FIG. 9 is a circuit diagram showing the circuit configuration of a magnet coil drive control device according to a modification of the second embodiment shown in FIG. 8.

Referring now to FIGS. 8 and 9, a second embodiment of the present invention is described in detail. In the second embodiment, two solenoids 3 are used, and the two solenoids 3 are magnet coils of hydraulic control valves that are used as an inlet valve and an outlet valve in a valve timing control device, for example.

The embodiment shown in FIG. 8 is characterized by including two drive circuits that are the same as the drive circuit shown in FIG. 1, and having an impedance element 7 and a capacitor 6 shared between the two drive circuits. The functions of the impedance element 7 and the capacitor 6 are substantially the same as the functions of the impedance element 7 and the capacitor 6 shown in FIG. 1. Therefore, explanation of the functions of the impedance element 7 and the capacitor 6 will not be made, and the circuit configurations will be described below.

One of the drive circuits is formed with a solenoid 3a, a connecting line L2a, a switching element 4a, and a freewheeling diode 5a, and the other one of the drive circuits is formed with a solenoid 3n, a connecting line L2n, a switching element 4n, and a freewheeling diode 5n. The fundamental connections among them are substantially the same as those in the circuit shown in FIG. 1. The respective cathodes of the freewheeling diode 5a and the freewheeling diode 5n are connected to a connecting line L3 between the impedance element 7 and the capacitor 6. In this structure, only one impedance element 7 and only one capacitor 6 are required, and the number of components can be effectively reduced. In this case, the capacitance of the capacitor 6 and the resistance value of the impedance element 7 need to be adjusted to a value suitable for the two drive circuits.

The embodiment shown in FIG. 9 is a modification of the embodiment shown in FIG. 8. Two drive circuits that are the same as the drive circuit shown in FIG. 1 are provided, and impedance elements and capacitors are provided in the respective drive circuits. In this embodiment, the functions of the impedance elements 7 and the capacitors 6 are also substantially the same as the functions of the impedance element 7 and the capacitor 6 shown in FIG. 1. Therefore, explanation of the functions of the impedance elements 7 and the capacitors 6 will not be made, and the circuit configurations will be described below.

One of the drive circuits is formed with a solenoid 3a, a connecting line L2a, a switching element 4a, and a freewheeling diode 5a, and the other one of the drive circuits is formed with a solenoid 3n, a connecting line L2n, a switching element 4n, and a freewheeling diode 5n. The cathode of the freewheeling diode 5a as well as an impedance element 7a and a capacitor 6a are connected to a line L3a, and the cathode of the freewheeling diode 5n as well as an impedance element 7n and a capacitor 6n are connected to a line L3n. The fundamental connections among them are substantially the same as those in the circuit shown in FIG. 1.

According to this embodiment, the impedance elements 7a and 7n, and the capacitors 6a and 6n exist in the two drive circuits independently of each other. This is particularly effective in reducing loss in the impedance elements 7. In the embodiment shown in FIG. 8, the impedance element 7 is shared between the two drive circuits, and therefore, the resistance value of the impedance element 7 becomes higher. As a result, loss might become large as shown in FIG. 6. In the embodiment shown in FIG. 9, however, the impedance elements 7a and 7n are provided in the respective drive circuits. Accordingly, the resistance value can be made lower, and loss can be made smaller. Although each impedance element 7 is a resistor in this embodiment, it is possible to use any of the impedance elements 7 having the structures shown in FIGS. 7A through 7F.

As described above, according to the second embodiment shown in FIGS. 8 and 9, capacitor(s) 6 and impedance element(s) can be provided in drive circuits with solenoids 3. Accordingly, conduction noise is reduced, and the capacitance of the capacitor(s) is reduced. Thus, the magnet coil drive control device can be made smaller in size.

Third Embodiment

Figure 10:
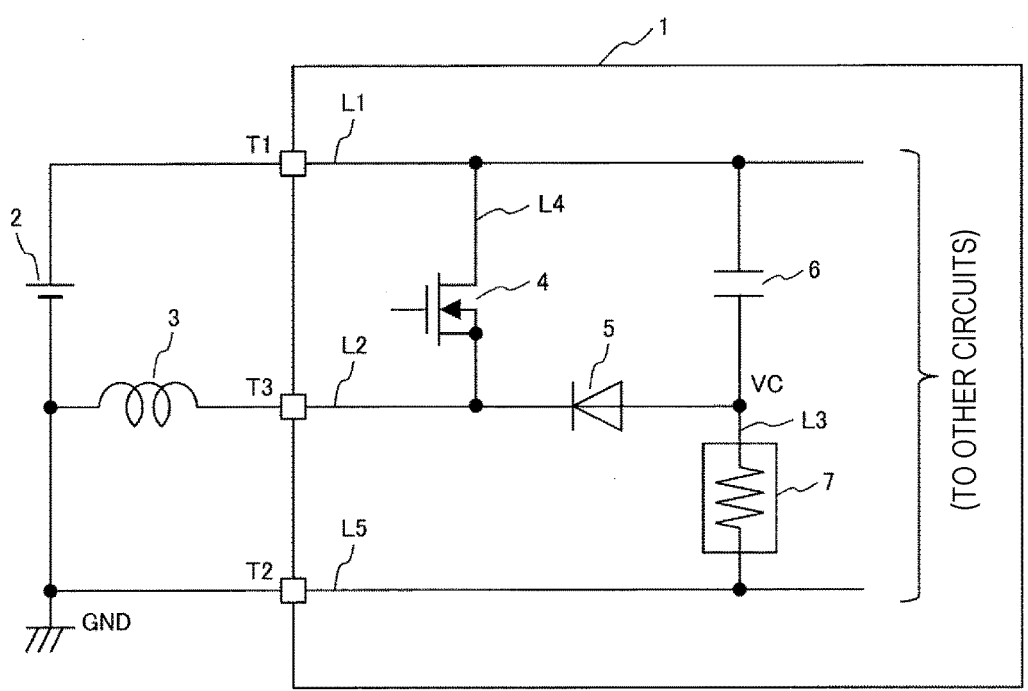
FIG. 10 is a circuit diagram showing the circuit configuration of a magnet coil drive control device according to a third embodiment of the present invention.

Referring now to FIG. 10, a third embodiment of the present invention is described in detail. In the magnet coil drive control device shown in FIG. 1, the switching element 4 is a low-side switch. In the third embodiment, however, the switching element 4 is a high-side switch. The functions of the impedance element 7 and the capacitor 6 are substantially the same as the functions of the impedance element 7 and the capacitor 6 shown in FIG. 1. Therefore, explanation of the functions of the impedance element 7 and the capacitor 6 will not be made, and the circuit configurations will be described below.

Terminals T1, T2, and T3 are provided in the magnet coil drive control device 1. The terminal T1 is connected to a DC power supply 2 such as the positive electrode terminal of an in-vehicle battery, the terminal T2 is connected to the negative electrode terminal of the DC power supply 2, and the terminal T3 is connected to the positive electrode terminal of the DC power supply 2 via a solenoid 3. This solenoid 3 is a coil for forming an electromagnet, and the hydraulic control valve shifts in position depending on the current flowing in the solenoid 3. Accordingly, the oil quantity of the hydraulic mechanism can be adjusted. This type of mechanism is well known, and therefore, will not be described in detail herein.

The terminal T1 is connected to a positive electrode line L1 in the magnet coil drive control device 1, and the terminal T2 is connected to a negative electrode line L5 in the magnet coil drive control device 1. The positive electrode line L1 and the negative electrode line L5 are connected by a connecting line L3, and, on the connecting line L3, a capacitor 6 and an impedance element 7 are arranged and connected in series in the direction from the positive electrode line L1 toward the negative electrode line L5. The connecting line L3 between the capacitor 6 and the impedance element 7 is connected to one end of the solenoid 3 by a connecting line L2, and a freewheeling diode 5 is provided on the connecting line L2. The anode side of the freewheeling diode 5 is connected to the connecting line L3 between the capacitor 6 and the impedance element 7, and the cathode side of the freewheeling diode 5 is connected to the one end of the solenoid 3.

Further, the portion between the cathode side of the freewheeling diode 5 and the one end of the solenoid 3 is connected to the positive electrode line L1 by a connecting line L4, and a switching element 4 as a high-side switch is connected to the connecting line L4. This switching element 4 is a MOS-FET, the source side of the switching element 4 is connected to the portion between the cathode side of the freewheeling diode 5 and the one end of the solenoid 3, and the drain side of the switching element 4 is connected to the positive electrode line L1.

The positive electrode side of the DC power supply 2 is connected to another circuit in the magnet coil drive control device 1 via the positive electrode line L1, and the GND side of the DC power supply 2 is connected to another circuit in the magnet coil drive control device 1 via the negative electrode line L5, so that power is supplied thereto. However, this aspect is not relevant to the present invention, and will not be described in detail herein.

In this embodiment described above, the switching element is a high-side switch. Therefore, the behavior of the freewheeling current differs from that of the first embodiment, but the principle thereof is the same.

When a predetermined control signal is supplied to the gate of the switching element 4, the switching element 4 transits to an on-state, the drain voltage becomes 0 V, and current flows into the solenoid 3. The current flowing into the solenoid 3 is the driving current that flows into the solenoid 3 as the DC power supply 2 and the solenoid 3 form a closed circuit when the switching element 4 is in an on-state. This driving current increases with time, and electrical energy is accumulated in the inductance of the solenoid 3.

When the switching element 4 transits to an off-state, on the other hand, the solenoid 3, the freewheeling diode 5, and the impedance element 7 form a closed circuit, and a freewheeling current flows. The freewheeling current flows so that the energy accumulated in the inductance of the solenoid 3 is released, and the current decreases with time.

The freewheeling current is the current that flows as the solenoid 3, the freewheeling diode 5, and the impedance element 7 form a closed circuit when the switching element 4 is in an off-state. When the switching element 4 is in an on-state, the cathode voltage of the freewheeling diode 5 is 14 V, and therefore, the cathode voltage is high. That is, a reverse bias state is formed, and any freewheeling current does not flow.

Furthermore, when the switching element 4 is in an off-state, the DC power supply 2, the solenoid 3, the freewheeling diode 5, and the capacitor 6 form a closed circuit, and charge is accumulated in the capacitor 6. When the switching element 4 is in an on-state, on the other hand, current does not flow into the freewheeling diode 5. Therefore, the charge accumulated in the capacitor 6 while the switching element 4 is in an off-state flows out toward the impedance element 7.

The charge (voltage) accumulated in the capacitor 6 is applied to the negative electrode line L5. However, there is the impedance element 7 provided between the capacitor 6 and the negative electrode line L5 in this embodiment. Therefore, the charge accumulated in the capacitor 6 is consumed by the impedance element 7, and does not appear on the negative electrode line L5. With this, ripple voltage generation is restrained on the negative electrode line L5, and conduction noise can be reduced. This ripple voltage is conduction noise at the high frequency corresponding to the on/off ratio in the solenoid 3.

As described above, according to the third embodiment, the capacitor 6 and the impedance element 7 are provided on the connecting line L3 connecting the positive electrode line L1 and the negative electrode line L5 of the DC power supply, and are arranged in series in the direction from the positive electrode line L1 toward the negative electrode line L5. The connecting line L3 between the capacitor 6 and the impedance element 7 is connected to one end of the solenoid 3 via the freewheeling diode so that a freewheeling current flows toward the solenoid side. Further, the portion between the cathode side of the freewheeling diode 5 and the one end of the solenoid 3 is connected to the positive electrode line L1 by the high-side switching element 4.

In this structure, conduction noise caused by the driving current of the solenoid 3 can be suppressed by the impedance element 7, and the capacitance of the capacitor 6 can be further reduced. Accordingly, the magnet coil drive control device can be made smaller in size.

Fourth Embodiment

Figure 11:
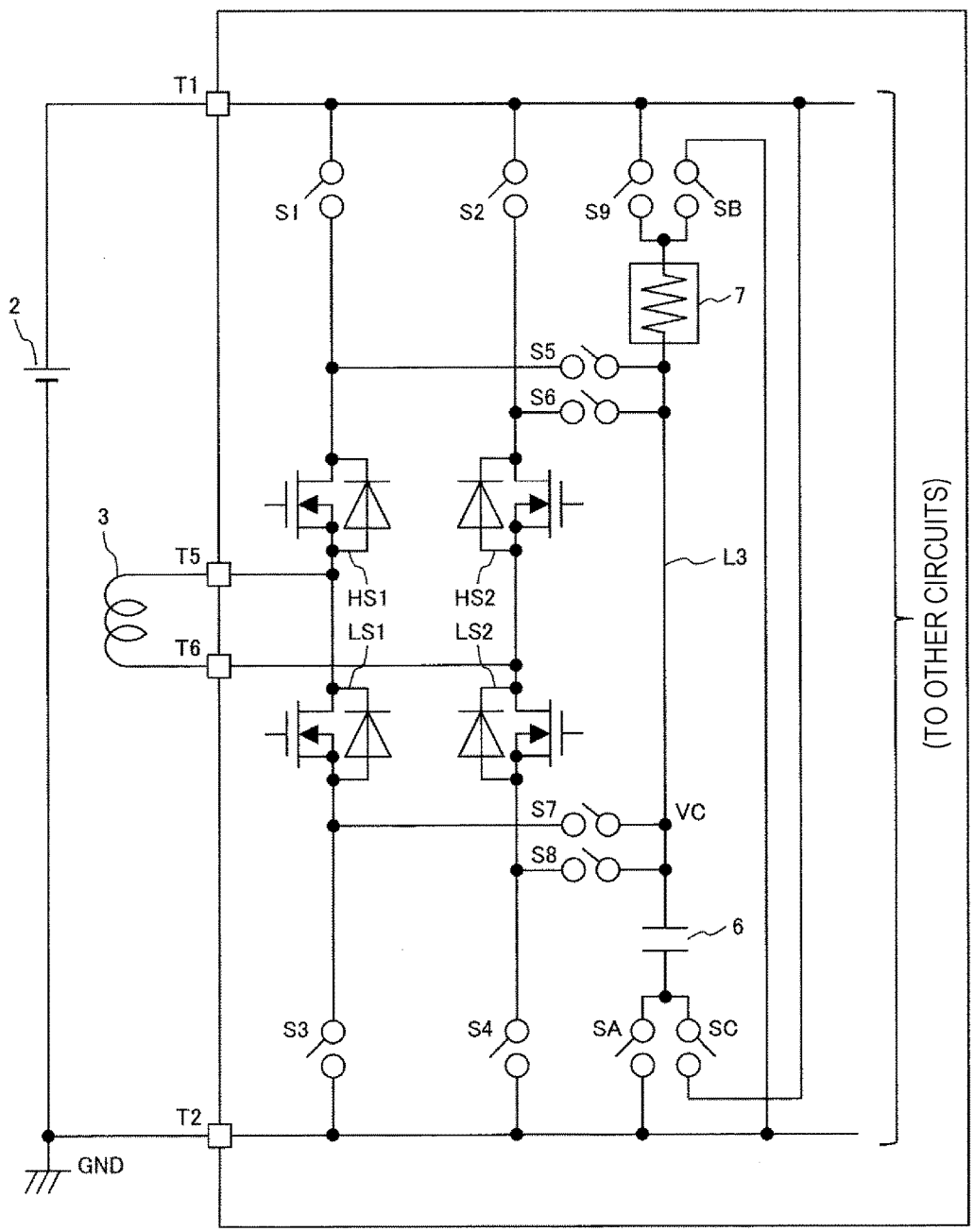
FIG. 11 is a circuit diagram showing the circuit configuration of a magnet coil drive control device according to a fourth embodiment of the present invention.
Figure 12:
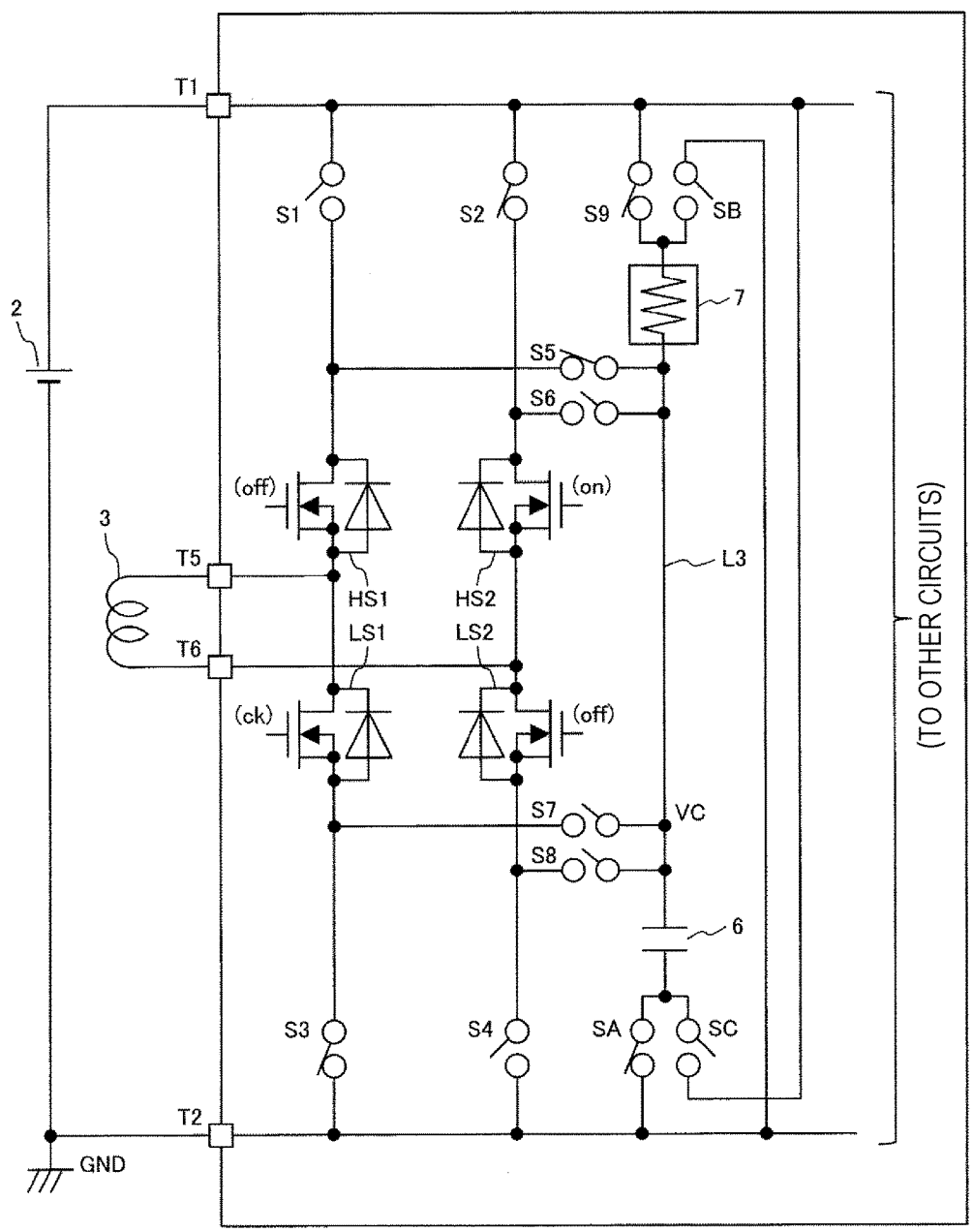
FIG. 12 is a circuit diagram for explaining operating states of the magnet coil drive control device according to the fourth embodiment shown in FIG. 11.

Referring now to FIGS. 11 through 13, a fourth embodiment of the present invention is described in detail. This embodiment shows a motor drive control device that uses an H-bridge circuit. The functions of the impedance element 7 and the capacitor 6 are substantially the same as the functions of the impedance element 7 and the capacitor 6 shown in FIG. 1. Therefore, explanation of the functions of the impedance element 7 and the capacitor 6 will not be made, and the circuit configurations will be described below.

Referring first to FIG. 11, the configuration of the drive circuit of the magnet coil drive control device according to the fourth embodiment is described. This embodiment is characterized by switching between the impedance element 7 and the capacitor 6 used in an H-bridge circuit. That is, the H-bridge circuit is a preferred circuit configuration for controlling a motor, and is characterized by controlling the connection state between the impedance element 7 and the capacitor 6 in accordance with the operating states of four MOS-FETs.

Four MOS-FETs are used in the H-bridge circuit, and high-side switching elements HS1 and HS2, and low-side switching elements LS1 and LS2 are connected to terminals T5 and T6 of a magnet coil 3 of a motor. The relationship of connection among the terminals T5 and T6 of the magnet coil 3, the high-side switching elements HS1 and HS2, and the low-side switching elements LS1 and LS2 is a well-known relationship. Each MOS-FET has a parasitic diode formed between the source and the drain, or includes a so-called body diode.

The drain side of the high-side switching element HS1 and the drain side of the high-side switching element HS2 are connected to the power supply side of a DC power supply 2 via a terminal T1 through a switch S1 and a switch S2, respectively. The source side of the low-side switching element LS1 and the source side of the low-side switching element LS2 are connected to the GND side of the DC power supply 2 via a terminal T2 through a switch S3 and a switch S4, respectively. Also, the source side of the high-side switching element HS1, the drain side of the low-side switching element LS1, and one end of the magnet coil 3 are connected by the terminal T5, and the source side of the high-side switching element HS2, the drain side of the low-side switching element LS2, and the other end of the magnet coil are connected by the terminal T6. This circuit forms an H-bridge circuit that drives a motor.

The impedance element 7 and the capacitor 6 according to this embodiment have the circuit configurations described below. The impedance element 7 and the capacitor 6 are connected to the power supply side of the DC power supply 2 through a switch S9 and a switch SC, respectively. The impedance element 7 and the capacitor 6 are further connected to the GND side of the DC power supply 2 through a switch SB and a switch SA, respectively.

Further, a connecting line L3 between the impedance element 7 and the capacitor 6 is connected to the drain side of the high-side switching element HS1 through a switch S5, and is connected to the drain side of the high-side switching element HS2 through a switch S6. Likewise, the connecting line L3 is connected to the source side of the low-side switching element LS1 through a switch S7, and is connected to the source side of the low-side switching element LS2 through a switch S8.

Referring now to FIG. 13, operating states of the above described magnet coil drive control device of the fourth embodiment are described. The circuit shown in FIG. 11 has four operating states. FIG. 13 shows the on- or off-states of the switching elements HS1, HS2, LS1, and LS2, and the on- or off-states of the switches S1 through SC in the respective operating states. The on- or off-states of the switching elements HS1, HS2, LS1, and LS2, and the on- or off-states of the switches S1 through SC are controlled by an electronic control unit not shown in the drawing.

Specifically, in operation mode 1, the high-side switching element HS2 enters an on-state, and the low-side switching element LS1 serves as the low-side switch and is repeatedly switched on and off by a control signal from the electronic control unit. In operation mode 2, the high-side switching element HS1 enters an on-state, and the low-side switching element LS2 serves as the low-side switch and is repeatedly switched on and off by a control signal from the electronic control unit. The operation model and the operation mode 2 are the same as the embodiment using the low-side switching element 4 shown in FIG. 1.

In operation mode 3, the low-side switching element LS2 enters an on-state, and the high-side switching element HS1 serves as the high-side switch and is repeatedly switched on and off by a control signal from the electronic control unit. In operation mode 4, the low-side switching element LS1 enters an on-state, and the high-side switching element HS2 serves as the high-side switch and is repeatedly switched on and off by a control signal from the electronic control unit. The operation mode 3 and the operation mode 4 are the same as the embodiment using the high-side switching element 4 shown in FIG. 10.

Here, the respective switches S1 through SC are selected and driven in accordance with operations of the respective switching elements HS1, HS2, LS1, and LS2.

Referring now to FIG. 12, operations of the respective switches S1 through SC and the switching elements HS1, HS2, LS1, and LS2 in the operation mode 1 are described, for example.

To put the H-bridge circuit into the operation mode 1, the settings in the H-bridge circuit are as shown in FIG. 13. That is, the switch S2 and the switch S3 are put into an on-state, and the switch S1 and the switch S4 are put into an off-state. The high-side switching element HS2 is put into an on-state, and the high-side switching element HS1 and the low-side switching element LS2 are put into an off-state. Here, the body diode included in the high-side switching element HS1 is equivalent to a freewheeling diode. The low-side switching element LS1 is put into an switching state and is repeatedly switched on and off in accordance with a control signal (an on/off signal) applied from the electronic control unit.

To connect the impedance element 7 to the power supply side of the DC power supply 2, the switch S9 is put into an on-state, and the switch SB is put into an off-state. With this, the impedance element 7 is connected to the power supply side of the DC power supply 2. Likewise, to connect the capacitor 6 to the GND side of the DC power supply 2, the switch SA is put into an on-state, and the switch SC is put into an off-state. With this, the capacitor 6 is connected to the GND side of the DC power supply 2.

Further, the connecting line L3 between the impedance element 7 and the capacitor 6 is connected to the drain side of the high-side switching element HS1, and accordingly, is connected to the cathode side of the body diode (=the freewheeling diode). Therefore, in the operation mode 1, the switch S5 is put into an on-state, and the switches S6, S7, and S8 are put into an off-state.

The setting state of the operation mode 1 set in the above described manner is set to the same low-side switch as that in the circuit configuration of the first embodiment. Operation of this circuit is the same as that of the first embodiment, and therefore, will not be described in detail.

Further, in the operation modes 2, 3, and 4, operations of the respective switches S1 through SC are selected in accordance with operations of the respective switching elements HS1, HS2, LS1, and LS2, so that the same operations as above can be performed.

As described above, the H-bridge circuit is formed with a combination of two half-bridge circuits arranged on the right and left sides. Each of the half-bridge circuits has the characteristics of both a low-side switch and a high-side switch. Accordingly, if switches in the H-bridge circuit are appropriately selected, the impedance element and the capacitor of the first embodiment or the third embodiment can be used in conjunction with the H-bridge circuit.

To summarize the present invention, a capacitor and an impedance element are arranged in series on the connecting line connecting the positive electrode line and the negative electrode line of a DC power supply, the connecting line between the capacitor and the impedance element is connected to one end of a magnet coil via a freewheeling diode, and the portion between the freewheeling diode and the one end of the magnet coil is connected to the positive electrode line or the negative electrode line by a switching element.

With this structure, conduction noise caused by the driving current of the magnet coil can be suppressed by the impedance element, and the capacitance of the capacitor can be further reduced. Accordingly, the magnet coil drive control device can be made smaller in size.

REFERENCE SIGNS LIST

1 magnet coil drive control device
2 DC power supply
3, 3*a*, 3*n* magnet coil (solenoid)
4, 4*a*, 4*n* switching element
5, 5*a*, 5*n* freewheeling diode
6, 6*a*, 6*n* capacitor
7, 7*a*, 7*n* impedance element
L1 positive electrode line
L2, L3, L4 connecting line
L5 negative electrode line
L2*a*, L2*n*, L3*a*, L3*n*, L4*a*, L4*n* connecting line
HS1, HS2 high-side switching element
LS1, LS2 low-side switching element
S1, S2, S3, S4, S5, S6, S7, S8, S9, SA, SB, SC, SD switch

The invention claimed is:

1. A magnet coil drive control device comprising:
a first magnet coil having one end connected to a positive electrode side of a DC power supply;
a second magnet coil having one end connected to the positive electrode side of the DC power supply;
an impedance element;
a capacitor connected in series to the impedance element;
a first circuit that is connected to the impedance element and to the capacitor; and
a second circuit connected in parallel to the first circuit, wherein
the first circuit includes
a switching element configured to turn on and off current flowing into the first magnet coil, the switching element being directly connected to the other end of the first magnet coil; and
a freewheeling diode configured to cause electrical energy accumulated in the first magnet coil to freewheel as a freewheeling current when the switching element is in an off-state,
the second circuit includes
another switching element configured to turn on and off current flowing into the second magnet coil, the another switching element being directly connected to the other end of the second magnet coil; and
another freewheeling diode configured to cause electrical energy accumulated in the second magnet coil to freewheel as a freewheeling current when the another switching element is in an off-state,
the capacitor and the impedance element are arranged on a connecting line directly connecting a positive electrode line and a negative electrode line of the DC power supply, the connecting line between the capacitor and the impedance element is connected to the other end of the first magnet coil via the freewheeling diode and is connected to the other end of the second magnet coil via the another freewheeling diode, a connecting line between the freewheeling diode and the other end of the first magnet coil is further connected to one of the positive electrode line and the negative electrode line by a connecting line having the switching element thereon, a connecting line between the another freewheeling diode and the other end of the second magnet coil is further connected to one of the positive electrode line and the negative electrode line by a connecting line having the another switching element thereon, and the impedance element and the capacitor are shared between the first circuit and the second circuit.

2. The magnet coil drive control device according to claim wherein at least a resistor is used as the impedance element.

3. The magnet coil drive control device according to claim 2, wherein the impedance element is formed with one of a passive element and an active element combined with the resistor.

4. The magnet coil drive control device according to claim 2, wherein the impedance element includes an adjusting element capable of adjusting a resistance value.

5. A magnet coil drive control device comprising:
a first magnet coil having one end connected to a positive electrode side of a DC power supply;
a second magnet coil having one end connected to the positive electrode side of the DC power supply;
an impedance element;
a capacitor connected in series to the impedance element;
a first circuit that is connected to the impedance element and to the capacitor, and a second circuit connected in parallel to the first circuit, wherein
the first circuit includes
a switching element configured to turn on and off current flowing into the first magnet coil, the switching element being directly connected to the other end of the first magnet coil; and
a freewheeling diode configured to cause electrical energy accumulated in the first magnet coil to freewheel as a freewheeling current when the switching element is in an off-state,
the second circuit includes
another switching element configured to turn on and off current flowing into the second magnet coil, the another switching element being directly connected to the other end of the second magnet coil; and
another freewheeling diode configured to cause electrical energy accumulated in the second magnet coil to freewheel as a freewheeling current when the another switching element is in an off-state,
the impedance element and the capacitor are provided on a connecting line directly connecting a positive electrode line and a negative electrode line of the DC power supply, the impedance element and the capacitor being arranged in a direction from the positive electrode line toward the negative electrode line,
the connecting line between the impedance element and the capacitor is connected to the other end of the first magnet coil via the freewheeling diode and is connected to the other end of the second magnet coil via the another freewheeling diode, to cause the freewheeling current to flow into the impedance element and the capacitor, a connecting line between an anode side of the freewheeling diode and the other end of the first magnet coil is further connected to the negative electrode line by a connecting line having the switching element thereon, the switching element being a low-side switching element, and a connecting line between an anode side of the another freewheeling diode and the other end of the second magnet coil is further connected to the negative electrode line by a connecting line having the another switching element thereon, the another switching element being another low-side switching element, and the impedance element and the capacitor are shared between the first circuit and the second circuit.

6. A magnet coil drive control device comprising:
a first magnet coil having one end connected to a positive electrode side of a DC power supply;
a second magnet coil having one end connected to the positive electrode side of the DC power supply;
an impedance element;
a capacitor connected in series to the impedance element;
a first circuit that is connected to the impedance element and to the capacitor; and
a second circuit connected in parallel to the first circuit, wherein
the first circuit includes
a switching element configured to turn on and off current flowing into the first magnet coil, the switching element being directly connected to the other end of the first magnet coil; and
a freewheeling diode configured to cause electrical energy accumulated in the first magnet coil to freewheel as a freewheeling current when the switching element is in an off-state,
the second circuit includes
another switching element configured to turn on and off current flowing into the second magnet cod, the another switching element being directly connected to the other end of the second magnet coil; and
another freewheeling diode configured to cause electrical energy accumulated in the second magnet coil to freewheel as a freewheeling current when the another switching element is in an off-state,
the capacitor and the impedance element are provided on a connecting line directly connecting a positive electrode line and a negative electrode line of the DC power supply, the capacitor and the impedance element being arranged in a direction from the positive electrode line toward the negative electrode line,
the connecting line between the capacitor and the impedance element is connected to the other end of the first magnet coil via the freewheeling diode, to cause the freewheeling current to flow toward the first magnet coil,
the connecting line between the capacitor and the impedance element is connected to the other end of the second magnet coil via the another freewheeling diode, to cause the freewheeling current to flow toward the second magnet coil,
a connecting line between a cathode side of the freewheeling diode and the other end of the first magnet coil is further connected to the positive electrode line by a connecting line having the switching element thereon, the switching element being a high-side switching element, a connecting line between a cathode side of the another freewheeling diode and the other end of the second magnet coil is further connected to the positive electrode line by a connecting line having the another switching element thereon, the another switching element being another high-side switching element, the impedance element and the capacitor are shared between the first circuit and the second circuit.

* * * * *